United States Patent
Foster et al.

(10) Patent No.: US 6,706,464 B2
(45) Date of Patent: Mar. 16, 2004

(54) METHOD OF FABRICATING CIRCUITIZED STRUCTURES

(75) Inventors: Elizabeth Foster, Friendsville, PA (US); Gary A. Johansson, Hockessin, DE (US); Heike Marcello, Brackney, PA (US); David J. Russell, Apalachin, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/345,561

(22) Filed: Jan. 16, 2003

(65) Prior Publication Data

US 2003/0129536 A1 Jul. 10, 2003

Related U.S. Application Data

(62) Division of application No. 09/808,334, filed on Mar. 14, 2001, now Pat. No. 6,528,218, which is a division of application No. 09/212,204, filed on Dec. 15, 1998, now abandoned.

(51) Int. Cl.$^7$ ................................................. G03F 7/40
(52) U.S. Cl. ..................................... 430/315; 430/272.1
(58) Field of Search ............................. 430/315, 272.1

(56) References Cited

U.S. PATENT DOCUMENTS

| | | | |
|---|---|---|---|
| 3,469,982 A | 9/1969 | Celeste | 96/35.1 |
| 3,794,576 A | 2/1974 | Watt | 204/159.11 |
| 3,984,244 A * | 10/1976 | Collier et al. | 430/315 |
| 4,075,051 A | 2/1978 | Brzozowski | 156/236 |
| 4,193,799 A | 3/1980 | Crivello | 430/319 |
| 4,451,550 A | 5/1984 | Bennett et al. | 430/176 |
| 4,544,623 A | 10/1985 | Audykowski et al. | 430/280 |
| 4,624,912 A | 11/1986 | Zweifel et al. | 430/258 |
| 4,948,700 A * | 8/1990 | Maeda et al. | 430/280.1 |
| 4,985,340 A * | 1/1991 | Palazzotto et al. | 430/270.1 |
| 4,994,346 A | 2/1991 | Meier et al. | 430/280 |
| 5,008,175 A * | 4/1991 | Hsieh et al. | 430/155 |
| 5,026,624 A * | 6/1991 | Day et al. | 430/280.1 |
| 5,079,129 A | 1/1992 | Roth et al. | 430/280 |
| 5,397,685 A | 3/1995 | Daniels et al. | 430/325 |
| 5,439,766 A | 8/1995 | Day et al. | 430/18 |
| 5,665,650 A * | 9/1997 | Lauffer et al. | 216/20 |
| 5,830,374 A * | 11/1998 | Boyko et al. | 216/13 |
| 6,027,858 A * | 2/2000 | Jones et al. | 430/311 |
| 6,204,456 B1 * | 3/2001 | Lauffer et al. | 174/262 |
| 2001/0006759 A1 * | 7/2001 | Shipley et al. | 430/280.1 |

OTHER PUBLICATIONS

"Photoimagable Laminates for Thin Applications", IBM Technical Disclosure Bulletin, Apr. 1995, vol. 38, Issue No. 4, pp. 359–360. (TDB–ACC–No. NN9504359).*

"plate", "plated, plating, plates" The American Heritage Dictionary, Second College Edition, Houghton Mifflin Company, Bostaon, MA, 1982, p. 949.*

IBM Technical Disclosure Bulletin, Improved Composition for a Dry Film Soldermask, vol. 33, No. 7, Dec., 1990, pp. 162–163.

* cited by examiner

*Primary Examiner*—Cynthia Hamilton
(74) *Attorney, Agent, or Firm*—William N. Hogg

(57) ABSTRACT

A method for fabricating circuitized substrates which reduces shorts, and does not require baking and resulting film. The method employs a photoimageable dielectric film, having a solvent content less than about 5%, and a glass transition temperature, when cured, which is greater than about 110° C. A photoimageable dielectric film, is provided having from about 95% to about 100% solids, and comprising: from 0% to about 30% of the solids, of a particulate rheology modifier, from about 70% to about 100% of the solids of an epoxy resin system (liquid at 20° C. comprising: from about 85% to about 99.9% epoxy resins; and from about 0.1 to 15 parts of the total resin weight, a cationic photoinitiator; from 0 to about 5% solvent, applying the photoimageable dielectric film to a circuitized substrate; and exposing the film to actinic radiation.

8 Claims, 1 Drawing Sheet

METHOD OF FABRICATING CIRCUITIZED STRUCTURES

CROSS REFERENCE TO RELATED APPLICATION

This application is a divisional of application Ser. No. 09/808,334, filed Mar. 14, 2001 U.S. Pat. No. 6,528,218, which is a divisional of application Ser. No. 09/212,204, filed Dec. 15, 1998 and now abandoned.

BACKGROUND OF THE INVENTION

Photoimageable dielectrics in film form, rather than paste or liquid form, are desirable for a number of reasons. For example, liquid photoimageable dielectrics and paste photoimageable dielectrics run into and partially plug holes, such as via holes; upon development they typically leave a residue in the hole. This leads to defective circuitized substrates and reduces yields. The film photoimageable dielectrics are also employed to cover or "tent" holes thereby eliminating hole filling operations which are expensive and inconvenient. However, for photoimageable dielectric films to remain flexible and not crack during fabrication of the film, application and processing, about a 12% solvent content is typically employed. The presence of the solvent however, leads to additional problems. Often, such photoimageable dielectric films have a low Tg which in turn impairs dielectric properties of the photoimageable dielectric layer in the circuitized substrate. Also, such photoimageable dielectric films tend to stick to the photo-tool used in photoimaging. In an attempt to overcome such problems, such photoimageable dielectric films are baked prior to photoimaging, to drive off a portion of the solvent. However, the bake often causes the photoimageable dielectric film to become quite tacky while the photoimageable dielectric film is being heated. As a result, dust and debris from the bake oven and the ambient surroundings adheres to the surface of the photoimageable dielectric film. During subsequent photoimaging of the photoimageable dielectric film, the dust and debris block the transmission of the ultraviolet light during the photoimaging step. As a result, during the subsequent development of the photoimageable dielectric film, the photoimageable dielectric film which was shielded from the UV by the dust and debris, is unintentionally removed. The unintended removal of the photoimageable dielectric film produces an undesired void in the photoimaged dielectric film. When the workpiece is metallized, the void is often metallized, which may produce a short between circuitry lines.

It is desirable to have methods of fabricating circuitized structures which reduce the formation of unintentional voids or shorts, and which does not plug holes or leave residue in holes.

SUMMARY OF THE INVENTION

The present invention provides a new method for fabricating circuitized substrates which reduces the formation of shorts, and which does not require a bake step to drive off solvent before photoimaging. The method employs an essentially solventless photoimageable dielectric film, having a solvent content typically less than about 5%, preferably less than about 2% and a glass transition temperature, when cured, which is greater than about 110° C. The method for fabricating circuitized structures comprises the following steps: providing a photoimagable dielectric film, which film comprises: from about 95% to about 100% solids, comprising: from 0% to about 30% by weight of the solids, of a particulate rheology modifier; from about 70% to about 100% by weight of the solids of an epoxy resin system comprising: from about 85% to about 99.9% epoxy resins; and from about 0.1 to 15 parts by weight of the total resin weight, a cationic photoinitiator; from 0 to about 5% solvent; applying the photoimagable dielectric film to a circuitized substrate; then exposing the photoimagable dielectric film to actinic radiation.

The epoxy resin system comprises: from about 5% to about 80% of phenoxy polyol resin which is the condensation product of epichlorohydrin and bisphenol A, having a molecular weight of from about 40,000 to about 130,000; from about 0% to about 90% of an epoxidized multifunctional bisphenol A formaldehyde novolac resin having a molecular weight of from about 4,000 to about 10,000; from 20% to 80% of a diglycidyl ether of bisphenol A having a molecular weight of from about 600 to 2,500; from about 10% to about 35% liquid epoxy resin, having a molecular weight of from about 200 to about 600 preferably from about 250 to about 450. The "liquid epoxy resins" are liquid at 20° C. Preferably, the liquid epoxy resins are selected from the group consisting of: a cycloaliphatic epoxy resin, a bisphenol A epoxy resin, and mixtures thereof.

The solvent-less photoimageable dielectrics film eliminates the need for a bake step before photoimaging; thus the circuitized substrate with the non-crosslinked photoimagable dielectric film disposed thereon, is not exposed to, and does not accumulate dust and or debris from the bake oven.

The invention also relates to photoimagable dielectric films employed herein.

DETAILED DESCRIPTION OF THE INVENTION

Figure 1:
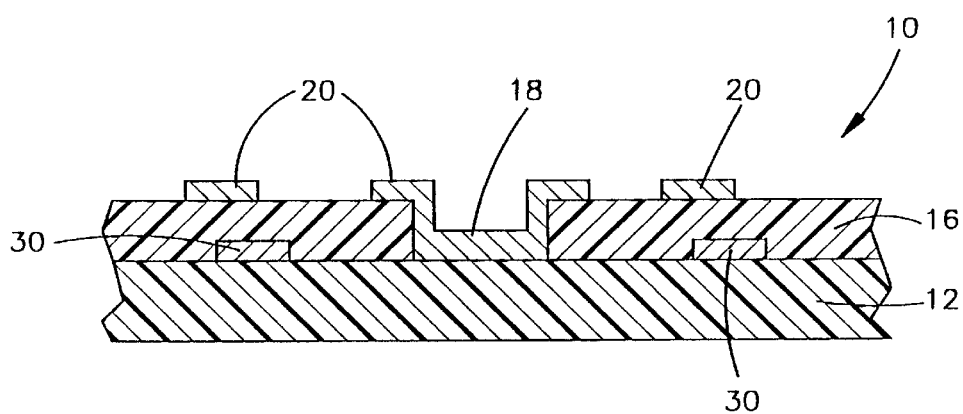
FIG. 1 is a cross section of a typically circuitized structure according to the methods of the present invention.

The present invention provides a new method for fabricating circuitized substrates which reduces the formation of unintentional voids, and does not require a bake step to drive off solvent before photoimaging. The method employs an essentially solventless photoimageable dielectric film, having a solvent content typically less than about 2% and a glass transition temperature, when cured, of preferably from about 110° C. to 150° C., more preferably from about 135° C. to about 145°. Preferably the glass transition temperature greater than about 110° C., more preferably greater than about 115° C., even more preferably greater than about 125° C.

The solventless photoimagable dielectric film eliminates the need for baking the film-substrate before photoimaging; thus the photoimagable dielectric film is not exposed to the dust and debris in the bake oven prior to exposure to actinic radiation.

The photoimagable dielectric film acts as a structural component in the circuitized structure, that is, the photoimagable dielectric film can function as a dielectric layer or solder mask; there is no need to remove the photoimagable dielectric film.

The Photoimagable Dielectric Film

The photoimagable dielectric film is a high resolution dielectric material. Preferably, the dielectric: constant of the photoimagable dielectric film is less than about 5, more preferably less than about 4. The photoimagable dielectric film is thermally stable up to about 340° C. The photoimagable dielectric film preferably is comprised of about 95 or more solids. The epoxy resin system comprises: from about 10 to 80% of phenoxy polyol resin which is the condensation product of epichlorohydrin and bisphenol A, having a molecular weight of from about 40,000 to about 130,000; from about 0% to about 90% of an epoxidized multifunctional bisphenol A formaldehyde novolac resin having a molecular weight of from about 4,000 to about 10,000; from 20% to 50% of a diglycidyl ether of bisphenol A having a molecular weight of from about 600 to 2,500; from about 10% to about 35% liquid epoxy resin, having a molecular weight of from about 200 to about 600 preferably from about 250 to about 450. The "liquid epoxy resins" are liquid at 20° C. Preferably, the liquid epoxy resins are selected from the group consisting of: a cycloaliphatic epoxy resin, a bisphenol A epoxy resin, and mixtures thereof.

In the first embodiment, the solids comprise an epoxy resin system which is preferably comprised of: from about 5% to about 80%, preferably from 10 to about 40%, more preferably from about 15% to about 30% of the phenoxy polyol resin which is the condensation product of epichlorohydrin and bisphenol A, having a molecular weight of from about 40,000 to about 130,000, preferably about 60,000 to about 90,000, more preferably greater than 60,000; from preferably from about 10% to about 90%, more preferably from about 12% to about 30%, most preferably from about 15% to about 20% of an epoxidized multifunctional bisphenol A formaldehyde novolac resin having a molecular weight of from about 4,000 to about 10,000, preferably about 5,000 to about 7,000; from about 20% to about 50.0%, preferably from about 25% to about 40%, more preferably about 27% to about 35% of a diglycidyl ether of bisphenol A having a molecular weight of from about 600 to about 2,500, preferably about 1,000 to about 1,700; from about 10% to about 35%, preferably from about 13% to about 32%, more preferably from about 20% to about 30%, liquid epoxy resin and from about 0.1 to about 15 parts, preferably about 5 parts, by weight of the total resin weight, a cationic photoinitiator. The solids optionally comprise a particulate rheology modifier from 0 to about 30%, preferably from 0.25% to about 30%, preferably from about 0.3% to about 5%, most preferably from about 0.5% to about 4%.

In a second embodiment, the solids comprise an epoxy resin system which is preferably comprised of: from about 5% to about 80%, preferably from 10 to about 40%, more preferably from about 15% to about 30% of the phenoxy polyol resin; 0% of the epoxidized multifunctional bisphenol A formaldehyde novolac resin; from about 20% to about 80%, preferably from about 30% to about 70%, more preferably about 40% to about 60% of the diglycidyl ether of bisphenol A; from about 10% to about 35%, preferably from about 13% to about 32%, more preferably about 20% to about 30%, liquid epoxy resin and from about: 0.1 to about 15 parts, preferably about 5 parts, by weight of the total resin weight, a cationic photoinitiator. The solids optionally comprise a particulate rheology modifier from 0 to about 30%, preferably from 0.25% to about 30%, preferably from about 0.3% to about 5%, most preferably from about 0.5% to about 4%.

The diglycidyl ether of bisphenol A is preferably halogenated, more preferably bromonated. The solvent component of the photoimageable dielectric film preferably is comprised of propylene glycol monomethyl ether acetate, 0 to less than about 10% of the solvent, propylene carbonate, 0 to less than about 5% methyl ethyl ketone. The propylene carbonate is preferably the carrier for the preferred photoinitiator.

Preferably, the phenoxy polyol resin has an epoxy value of from about 0.001 to about 3, more preferably from about 0.01 to about 0.3, most preferably about 0.03 equivalents per kg, a weight per epoxide of from about 10,000 to about 60,000, more preferably from about 20,000 to about 50,000, most preferably about 37,000 and a glass transition temperature of from about 80° to about 150° more preferably from about 90° to about 110°, most preferably about 98° C.

Preferably, the multifunctional epoxy bisphenol A formaldehyde novolac resin has an epoxy value of from about 1 to about 10 more preferably from about 3 to about 6, most preferably about 4.7 equivalents per kilogram, a weight per epoxide of from about 180 to about 300, more preferably from about 190 to about 230, most preferably about 215 and a melting point of from about 60° C. to about 150° C., more preferably from about 70° C. to about 90° C., most preferably about 82° C.

Preferably, the diglycidyl ether of the bisphenol A, has an epoxy value of from about 0.1 to about 5, more preferably from about 1 to about 3, most preferably about 1.5 equivalents per kilogram, a weight per epoxide of from about 200 to about 1000, more preferably from about 500 to about 750, most preferably about 675 and a melting point of from about 70° C. to about 150° C., more preferably from about 80° C. to about 110° C., most preferably about 97° C.

The liquid epoxy resin has a weight average molecular weight of from about 200 to about 500, preferably from about 250 to about 450. Preferably the liquid epoxy resin is either a bisphenol A epoxy resin or cycloaliphatic epoxy resin. The bisphenol A epoxy resin is a reaction product of bisphenol A and epichlorohydrin, and has an epoxy value of from about 10 to about 4, more preferably from about 7 to about 5, most preferably about 5.5 equivalents per kilogram, a weight per epoxide of from about 100 to about 250, more preferably from about 150 to about 200, most preferably about 180, a weight average molecular weight of from about 200 to about 500, preferably from about 250 to about 450, more preferably from about 300 to about 400, and a melting point of below about 20° C. A suitable bisphenol A epoxy resin is a difunctional bisphenol A epoxy resin available under the tradename Epon 826. The Epon 826 resin from Shell Oil Corporation has an epoxide equivalent weight of from about 178 to about 186 and a density of 1.6 grams/cm$^2$.

Preferably, the cycloaliphatic epoxy resin has an epoxy value of from about 10 to about 5, more preferably from about 8 to about 6, most preferably about 7.3 equivalents per kilogram, a weight per epoxide of from about 100 to about 200, more preferably from about 120 to about 150, most preferably about 137, a weight average molecular weight of from about 200 to about 500, preferably from about 250 to about 450, and preferably a melting point of below about 20° C. Preferably, the cycloaliphatic epoxy resin is a cycloaliphatic difunctional epoxy resin, more preferably cycloaliphatic epoxy resin is 3,4-epoxycyclohexylmethyl-3, 4-epoxycyclohexane-carboxylate. A suitable 3,4-epoxycyclohexylmethyl-3,4-epoxy-cyclohexane-carboxylate-resin is sold by Union Carbide under the trademark "ERL-4221." This resin has an epoxy equivalent weight of from 131 to about 143, a freezing point of less than −20° C., a specific gravity of 1.18, and an approximate average molecular weight of from about 262 to about 286.

Other suitable liquid epoxy resins are vinyl cyclohexene dioxide, available under the trade name "ERL-4206", from Union Carbide, 2-(3,4-epoxycyclohexyl-5,5-spiro-3,4-epoxy) cyclohexane-meta-dioxane, available-under the trade name "ERL-4234" from Union Carbide, Bis (3,4-epoxy cyclohexyl) adipate, available under the trade name "ERL 4299". ERL-4299 has a freezing point of approximately 9° C., a specific gravity of 1.15 and an epoxy equivalent weight of from about 190 to about 210 and an average approximate molecular weight of from about 380 to 420; ERL-4206has a freezing point of −55° C., a specific gravity of 1.09, an epoxy equivalent weight of from about 70 to about 74 and an average approximate molecular weight of from about 140 to 148; ERL-4234 has a melting point of approximately 00C, a specific gravity of 1.18, an epoxy equivalent weight of from about 133 to about 154 and an average approximate molecular weight of from about 266 to 318.

A suitable phenoxy polyol resin is available under the trade name "PKHC", or "PKHJ" formerly available from Union Carbide Corporation, now available from Phenoxy Resin Associates. A suitable octafunctional bisphenol A formerly available under the trade name Epirez SU-8 from High Tek Polymers, is now available as "Epon SU8" from Shell Chemical Company. A suitable tetrabromobisphenol A formerly available under the trade name "Epirez 5183" from High Tek Polymers, is now available as "Epon 1183" from Shell Chemical Company. A suitable complex triarylsulfonium hexafluoroantimonate salt photoinitiator formerly available under the trade name UVE 1014 from General Electric Company, is now available as UVI 6974from Union Carbide Company. The UVI 6974 is a 50% solution of triarylsulfonium hexafluoroantimonate salt in propylene carbonate.

The solids of the photoimageable dielectric film optionally comprise a particulate rheology modifier, preferably a thixotropic particulate rheology modifier. Preferably the particulate rheology modifier has an average particle size of from about 0.001 to about 10 microns, more preferably from about 0.01 to about 5 microns. Examples of particulate rheology modifiers are barium sulfate, talc, aluminum oxide, antimony oxide, kaolin, calcium, finely divided silicon dioxide which may be colloidal or rendered hydrophobic, micronised talcum, micronised mica, kaolin, aluminum oxide, aluminum hydroxide, calcium silicate, aluminum silicate, magnesium carbonate, calcium carbonate, zirconium silicate, porcelain powder, glass powder, antimony trioxide, titanium dioxide, barium titanate and barium sulfate or mixtured thereof.

Preferably the particulate rheology modifier is silica; a suitable silica is available from under the trade name Aerosil A380 silica from Degussa. Where the particulate rheology modifier is a thixotropic particulate rheology modifier, it is preferred that no more than 30% be used.

Optionally a surfactant, such as for example a nonionic surfactant is employed. Preferably the surfactant is a fluoronated polyether; a suitable surfactant is available under the trade name FC-430, from 3M Company.

The solvent content in the uncured photoimageable dielectric film preferably ranges from about 0 to 5%, more preferably from about 0 to 3%, most preferably from about 0 to 2%, by weight of the film.

Forming the Photoimageable Dielectric Film

First a liquid photoimageable dielectric is prepared by combining the epoxy resins, and photoinitiators and solvent and the optional ingredients and mixing thoroughly. Solvent is employed to permit thorough mixing and satisfactory application; good results have been obtained using from about 30% to about 70%. Alternatively, various components are premixed in batch form. When employing silica, it requires sufficient mixing to be evenly dispersed. Suitable mixers include for example vacuum high shear dispersion mixers.

The photoimageable dielectric film is prepared by coating the liquid photoimageable dielectric onto a support, which is preferably optically transparent to the actinic radiation used to photoimage the photoimageable dielectric film. Preferably the support is a polymeric support, such as polyester. Suitable polyester support for the photoresist film, includes, for example, polyethylene terephthalate available under the trade name MYLAR®, from DuPont, and MELINEX from ICI. The photoimageable dielectric is applied to the polymeric support in liquid form or paste form, using conventional application methods such as, for example, wound wire rod draw down technique, or reverse roll technique. The photoimageable dielectric film is baked to remove substantially all of the solvent; good results have been obtained by air drying typically from about 20 to about 40 minutes, then baking at from about 61° C. to about 150° C. for about 10 minutes.

Using the Photoimageable Dielectric Film to Fabricate Circuitized Structures

A polymeric cover sheet, also known as an interleaving, is peeled from the photoimageable dielectric film, if present, and the photoimageable dielectric film is placed film-side down onto the substrate. If the polymeric support is optically transparent, the polymeric support sheet remains atop the photoimageable dielectric film. (If the polymeric support is not optically transparent, then such polymeric support is removed and an optically transparent sheet is placed atop the photoimageable dielectric film.) Suitable substrates include for example, non-circuitized power cores, stiffeners, circuitized substrates such as circuit boards, cards, carriers, organic and inorganic single chip modules, organic or inorganic multi-chip modules, ceramic carriers and interposer cards. The photoimageable dielectric film is applied to the substrate, preferably by vacuum lamination. The photoimageable dielectric film is then photopatterned using conventional techniques, by exposing to actinic radiation, preferably ultraviolet light. The photoimageable dielectric film has the advantage of not needing to be dried prior to exposure to the actinic radiation. Preferably, the photoimageable dielectric film is exposed to ultraviolet light through desired artwork to expose areas corresponding to the position of the desired location of the apertures. The optically transparent sheet, which is preferably the support sheet, is removed from the photoimageable dielectric film, and photoimageable dielectric film is then baked to partially cure the photoimageable dielectric film in the areas exposed to actinic radiation.

The photoimageable dielectric film is then developed, preferably using propylene carbonate or butyrolactone to provide a photoimaged dielectric film having photoimaged apertures, such as photoimaged vias disposed therein. The photoimaged dielectric film is then finally cured, preferably in a two step process, first involving an exposure to ultraviolet light in the range of 250 to 400 nm, at from about 1 to about 8 $J/cm^2$, followed by a thermal cure. Good thermal cures have been obtained in a convection oven at 150° C. to 180° C. for 30 to 90 minutes. Since the support need not be peeled before exposure to the actinic radiation to permit solvent to evaporate as is need in the prior art, the film is, not subjected to dust and debris from the ambient environment.

Thereafter, a circuitized structure is fabricated using conventional techniques; the surface is modified to promote adhesion, vias, where present, are preferably plated, and metal circuitry, preferably, copper lines, are formed. Subsequently, a solder mask is preferably applied and conventional finishing steps are performed.

Thereafter, various electrical components such as for example, surface mount components, connectors, resistors, inductors, capacitors, ball grid array packages, wire bond devices, semiconductor devices, such as for example, chips, are attached, generally by soldering, to the circuitized structure, preferably by conventional techniques. The photoimageable dielectric film can withstand temperatures of soldering process such as at least about 183° C., for at least 20 minutes and even at least about 245° C. for at least 1 minute.

As a result of the methods of the present invention, the circuitized structure is produced. As shown in FIG. 1, the circuitized structure 10, is comprised of: substrate 12, a cured photoimaged, dielectric film 16, having metallized photopatterned vias 18, circuitry 20 disposed on dielectric film 16 and circuitry 30 on substrate 12. Vias 18 electrically connect circuitry 20 to circuitry 30. Vias 18 are rendered conductive by conventional techniques such as plating, filling with conductive paste and the like.

The resulting circuitized structures produced by the methods of the present invention include for example, circuit boards, cards, carriers, organic and inorganic single chip modules, organic or inorganic multi-chip modules, ceramic carriers and interposer cards.

The following examples are illustrative and not intended to limit the scope of the invention.

In many of the examples, of some of the components were premixed in batches which were used for convenience to formulated the liquid photoimageable dielectric used to make the photoimageable dielectric films of the present invention in formulation. For example batch 6 had the following composition having a solids content of about 40% in propylene glycol monomethyl ether acetate, such solids comprising: 28.54 PKHC a phenoxy resin; 23.79% of Epirez SU-8, an octafunctional epoxy bisphenol A formaldehyde novolac resin; 42.81% Epirez 5183 tetrabromo bisphenol A resin; 4.76% UVI 6974 photoinitiator; 0.07 ethylviolet dye; 0.03% FC 430 a fluorinated polyether nonionic surfactant from 3M Company.

Batch S had the following composition: having a solids content of about 50% in PGMEA, such solids comprising: about 28.54% PKHC a phenoxy resin; 42.81% of Epirez 5183 tetrabromobisphenol A; 23.79% of Epirez SU-8, an octafunctional epoxy bisphenol A formaldehyde novolac resin, 4.76% UVI 6974 photoinitiator; 0.07% ethylviolet dye; 0.03% FC 430 a fluorinated polyether nonionic surfactant from 3M Company; and 3% by weight of the solution of Aerosil A360, an amorphous silicon dioxide from Degussa.

EXAMPLE 1

A photoimageable dielectric film was prepared by combining 200 g premixed photoimageable dielectric formulation batch S and 100 g of premixed photoimageable dielectric formulation batch 6 and 21.6 g ERL 4221, and 25 g acetone and by mixing the solutions with a stirrer for about 1 to 2 hours, to provide a liquid photoimageable dielectric having about 12% ERL 4221 based on solids weight.

The liquid photoimageable dielectric was coated onto 1.42 mil thick Mylar D polyethylene terephthalate support from Dupont using a wound wire draw-down machine having a number 75 rod; about a 3 to 4 mil thick photoimageable dielectric film was applied wet. The photoimageable dielectric film was dried, in air typically about 20 to about 30 minutes, followed by an oven dry of about 6 to about 10 minutes at 60° to 150° C. to produce an about 2 mil photoimageable dielectric film having a solvent content of about 3 to about 5%.

EXAMPLE 2

A photoimageable dielectric film was prepared as in Example 1, except, that 49.6 g batch S and 72.1 g of batch 6 and 12.3 g Epon 826 were employed; the photoimageable dielectric film had about 17% Epon 826 based on solids weight. The photoimageable dielectric film when evaluated was brittle, and less preferred.

EXAMPLE 3

A photoimageable dielectric film was prepared as in Example 1, except that 49.5 g premixed photoimageable dielectric formulation batch S and 49.1 g of premixed photoresist formulation batch 6 and 11 g Epon 826, and 50.4 g acetone were employed; the photoimageable dielectric film had about 13.1% Epon 826 based on solids weight.

EXAMPLE 4

A photoimageable dielectric film was prepared as in Example 1, except that 51.5 g premixed batch S and 271.7 g of premixed batch 6 and 21 g ERL 4221, and 25 g acetone were employed; the photoimageable dielectric film had about 12.6% ERL 4221 based on solids weight.

EXAMPLE 5

A photoimageable dielectric film was prepared as in Example 1, except that 49.9 g premixed photoimageable dielectric formulation batch S and 98.9 g of premixed photoimageable dielectric formulation batch 6 and 13.2 g ERL 4221, were employed; the photoimageable dielectric film had about 16.7% ERL 4221 based on solids weight.

EXAMPLE 6

A photoimageable dielectric film was prepared as in Example 1, except that 50.3 g premixed batch S and 100.7 g of premixed batch 6 and 13 g Epon 826, were employed; the photoimageable dielectric film had about 13% Epon 826 based on solids weight.

The photoimageable dielectric film when evaluated was brittle, and not within a preferred embodiment suitable for use as a photoimageable: dielectric film.

EXAMPLE 7

A photoimageable dielectric film was prepared as in Example 1, except that 75.6 g premixed photoimageable dielectric formulation batch S and 98.3 g of premixed photoimageable dielectric formulation batch 6 and 25.1 g ERL 4221, were employed; the photoimageable dielectric film had about 25% ERL 4221 based on solids weight.

The photoimageable dielectric film when evaluated was flexible and did not crack when creased.

EXAMPLE 8

A photoimageable dielectric film was prepared as in Example 1, except that 100.7 g premixed photoimageable dielectric formulation batch 6 and 50.3 g of premixed photoimageable dielectric formulation batch S, and 15.5 g of Epon 826; were employed; the photoimageable dielectric film had 18.8% Epon 826.

The photoimageable dielectric film when evaluated was flexible, although it did crack when creased and thus is less preferred.

EXAMPLE 9

A photoimageable dielectric film was prepared as in Example 1, except that 120.2 g premixed batch 6 and 43.4 g of premixed batch S and 15.8 g of ERL 4221, were employed; the photoimageable dielectric film had about 18.2% ERL 4221 based on solids weight.

The photoimageable dielectric film when evaluated was flexible, although it did crack when creased and thus is less preferred.

EXAMPLE 10

A photoimageable dielectric film was prepared as in Example 1, except that 56.3 g premixed batch 6 and 24.6 g of premixed batch S and 10 g of ERL 4221, were employed; the photoimageable dielectric film had about 22% ERL 4221 based on solids weight.

The photoimageable dielectric film when evaluated was flexible, although it did crack when creased and thus is less preferred.

EXAMPLE 11

A photoimageable dielectric film was prepared as in Example 1, except that 54 g premixed batch 6 and 26.6 g of premixed batch S and 11 g of Epon 826, were employed; the photoimageable dielectric film had about 23.5% Epon 826 based on solids weight.

The photoimageable dielectric film when evaluated was flexible, although it did crack when creased and thus is less preferred.

EXAMPLE 12

The photoimageable dielectric film was prepared by preparing a liquid photoimageable dielectric which contained: 69.6 g PKHC a phenoxy resin; 67 g of Epon 1183 a tetrabromobisphenol A; 37 g of Epirez SU-8, an octafunctional epoxy bisphenol A formaldehyde novolac resin, 7 g UVI 6974 photoinitiator; and 35 g ERL 4221 a cycloaliphatic epoxy from Union Carbide Corporation. The solvent content was less than about 2% of the total photoimageable dielectric weight. The solvent was a mixture of methyl ethyl ketone, propylene carbonate and propylene glycol monomethyl ether acetate. The liquid photoimageable dielectric was coated onto 1.42 mil thick Mylar D polyethylene terephthalate support as in example 1.

EXAMPLE 13

The photoimageable dielectric film was prepared by preparing a liquid photoimageable dielectric which, contained: 72 g PKHJ a phenoxy resin; 67 g of Epon 1183 a tetrabromobisphenol A; 37 g of Epirez SU-8, an, octafunctional epoxy bisphenol A formaldehyde novolac resin, 7 g UVI 6974 photoinitiator; and 35 g ERL 4221 a cycloaliphatic epoxy from Union Carbide Corporation. The solvent content was less than about 2% of the total photoimageable dielectric film weight. The solvent was a mixture of methyl ethyl ketone, propylene carbonate and propylene glycol monomethyl ether acetate. The liquid photoimageable dielectric was coated onto 1.42 mil thick Mylar D polyethylene terephthalate support as in example 1.

EXAMPLE 14

A photoimageable dielectric film was prepared as in Example 1, except that 139.42 g premixed batch 6 and 34.92 g of premixed batch S and 24.45 g of ERL 4221, were employed; the photoimageable dielectric film had about 25% ERL 4221 based on solids weight.

EXAMPLE 15

A photoimageable dielectric film was prepared by combining 80 g of the liquid photoimageable dielectric of Example 7 with 0.42 g of the silane coupler A-186 from OSI Specialties Inc., and mixed for 30 minutes.

EXAMPLE 16

A photoimageable dielectric film was prepared as in Example 1, except that 126.9 g premixed photoimageable dielectric formulation batch 6 and 47.11 g of premixed photoimageable dielectric formulation batch S and 25 g of ERL 4221, were combined to provide a liquid photoimageable dielectric film having about 25% ERL 4221, based on solids weight, and 1.3% silica.

EXAMPLE 17

A photoimageable dielectric film was prepared as in Example 1, except that 114.7 g premixed photoimageable dielectric formulation batch 6 and 59.3 g of premixed photoimageable dielectric formulation batch S and 25 g of ERL 4221, were combined to provide a liquid photoimageable dielectric film having about 25% ERL 4221 based on solids weight and 1.6% silica.

EXAMPLE 18

A photoimageable dielectric film was prepared as in Example 1, except that 100 g of premixed photoimageable dielectric formulation batch 6 and 13 g ERL 4221, were combined to provide a liquid photoimageable dielectric having about 25% ERL 4221 based on solids weight.

EXAMPLE 19

A photoimageable dielectric film was prepared as in Example 1, except that 60 g premixed photoimageable dielectric formulation batch S and 25 g of premixed photoimageable dielectric formulation batch 6 and 13 g ERL 4221, were combined to provide a liquid photoimageable dielectric having about 25% ERL 4221 based on solids weight.

EXAMPLE 20

A photoimageable dielectric film was prepared as in Example 1, except that 80 g premixed photoimageable dielectric formulation batch S, 10 g methylethyl ketone and 13 g ERL 4221, were combined to provide a liquid photoimageable dielectric having about 25% ERL 4221 based on solids weight.

EXAMPLE 21

A photoimageable dielectric film was prepared by preparing a liquid photoimageable dielectric which contained: 7.49 g PKHC a phenoxy resin; 44.5 g of Epon 1183 a tetrabromobisphenol A; 17.59 g of Epirez SU-8, an octafunctional epoxy bisphenol A formaldehyde novolac resin, 6.97 g UVI 6974 photoinitiator; and 24.61 g ERL 4221 a cycloaliphatic epoxy from Union Carbide Corporation, 99.49 g methylethyl ketone and were combined to provide a liquid photoimageable dielectric having about 25.2% ERL 4221 based on solids weight. The solvent content was less than about 2% of the total photoimageable dielectric weight. The liquid photoimageable dielectric was coated onto a support as in example 1.

EXAMPLE 22

A photoimageable dielectric film was prepared as in Example 21, by preparing a liquid photoimageable dielectric which contained 11.57% g PKHC a phenoxy resin; 31.57 g of Epon 1183 a tetrabromobisphenol A; 25.10 g of Epirez SU-8, an octafunctional epoxy bisphenol A formaldehyde novolac resin, 6.94 g UVI 6974 photoinitiator; and 27.36 g ERL 4221 a cycloaliphatic epoxy from Union Carbide Corporation, and 99.6 g methylethyl ketone were combined to provide a liquid photoimageable dielectric having about 27.1% ERL 4221 based on solids weight. The solvent content was less than about 2% of the total photoimageable dielectric weight.

EXAMPLE 23

A photoimageable dielectric film was prepared comprising: about 24 g PKHC a phenoxy resin; 48.5 g of Epon 1183 a tetrabromobisphenol A; 7 g UVI 6974 photoinitiator; and 24 g ERL 4221 a cycloaliphatic epoxy from Union Carbide Corporation. The solvent content was less than about 2% of the total photoimageable dielectric weight. The solvent was a mixture of methyl ethyl ketone, propylene carbonate and propylene glycol monomethyl ether acetate. No particulate rheology modifier was added.

Examples 12, 13, 18, 21, and 22 were phase separated.

COMPARATIVE EXAMPLE

For comparison, a liquid photoimageable dielectric composition, which is outside the scope of this invention, was prepared having a solids content of from about 86.5 to 89%, such solids comprising: about 27.44% PKHC a phenoxy resin; 41.16% of Epirez 5183 a tetrabromobisphenol A; 22.88% of Epirez SU-8, an octafunctional epoxy bisphenol A formaldehyde novolac resin, 4.85% UVE 1014 photoinitiator; 0.07% ethylviolet dye; 0.03% FC 430 a fluorinated polyether nonionic surfactant from 3M Company; 3.85% Aerosil 380, an amorphous silicon dioxide from Degussa. The composition was applied as a liquid to a support and dried. The solvent content of the photoimageable dielectric composition was 11.5% to 13%. The solvent was a mixture of methyl ethyl ketone and propylene glycol monomethyl ether acetate. The photo-imageable dielectric composition was then applied to a substrate, and dried in an oven to drive off remaining solvent prior to photo imaging. As a result of the drying step, the solvent content was about 4-7%.

Evaluation

The photoimageable dielectric film was evaluated on the support for flexibility, by manually flexing, bending and creasing.

The photoimageable dielectric film of select examples, was also placed film side down onto one or both sides of a copper clad epoxy glass laminate printed circuit board. The photoimageable dielectric film was laminated using a Dynachem Model 730 vacuum laminator typically at from about 55° to about 100° C. platen temperature; 60 to 130 second dwell time, 7 to 15 second slapdown time. Good results were obtained at 60° C. with 130 second dwell time and an 8 second slap down time. The photoimageable dielectric film was exposed to from about 150 mJ/cm$^2$ to about 1000 mJ/cm$^2$ ultraviolet light through a test art work.

After the exposure to the UV light, the polyethylene terephthalate support was peeled from the photoimageable dielectric film. The photoimaged dielectric film was then baked; good results were obtained by baking at about 125° C. for about 30 minutes. The samples were developed using propylene carbonate or butyrolactone to form a resolution test pattern. The structures were then finally cured; they received a UV bump, that is, a second exposure to UV light; typically they received about 4 J/cm$^2$ at about 250 to 400 nm, followed by an oven bake; good results have been obtained by baking at 150° C. for about 60 minutes. Copper circuit lines, were plated on select examples using conventional techniques.

In addition to flexing the mylar coated sample, the photospeed of certain examples, as shown in table 1, were evaluated using a Stauffer 21 step wedge; and resolution was evaluated using a positive Air Force resolution target. The parallel plate rheology of Example 7 was evaluated. The results are presented in Table I.

TABLE I

| Example | Liquid Resin type | Liquid Resin % | Silica % | Step | Resolu | Dose mJ | Tg C | Flex Test | Cu adhesion lbs/in |
|---|---|---|---|---|---|---|---|---|---|
| Comp. Ex. | N/A | 0 | 3.9 | 5.0 | 2.0 | 1600 | 119 | Fail | |
| 1 | Erl | 12.0 | 4.0 | 9.0 | 5.5 | 600 | 120 | | |
| 2 | 826 | 17.0 | 2.1 | | | | | Fail | |
| 3 | 826 | 13.1 | 1.8 | | | | | Fail | |
| 4 | Erl | 12.6 | 0.9 | | | | | Fail | |
| 5 | Erl | 16.7 | 1.9 | | | | | | |
| 6 | 826 | 13.0 | 1.5 | 4.8 | 1.6 | 280 | 140 | Fail | |
| 7 | Erl | 24.6 | 2.1 | 6.1 | 1.6 | 280 | 140 | Pass | 2.9 |
| 8 | 826 | 18.8 | 1.8 | 3.9 | 2.0 | 350 | 141 | Marg. | |
| 9 | Erl | 18.2 | 1.5 | 6.9 | 2.2 | 260 | 141 | Marg. | |
| 10 | Erl | 21.9 | 1.6 | 5.0 | 1.5 | 250 | 137 | Marg. | |
| 11 | 826 | 23.6 | 1.7 | 2.0 | 1.2 | 250 | 139 | Marg. | |
| 12 | Erl | 20.9 | 0 | 2.7 | 7.2 | 200 | 129 | | |
| 13 | Erl | 20.9 | 0 | 2.2 | 6.2 | 200 | 130 | | |
| 14 | Erl | 25.0 | 1.0 | 3.1 | 1.3 | 175 | 126 | | |
| 15 | Erl | 24.6 | 2.1 | 2.9 | | 175 | | | |
| 16 | Erl | 25.2 | 1.3 | | | | | | |
| 17 | Erl | 24.8 | 1.6 | | | | | | |
| 18 | Erl | 24.5 | 0 | | | | | | 3.1 |
| 19 | Erl | 24.5 | 3.2 | | | | | | 2.0 |
| 20 | Erl | 24.5 | 4.3 | | | | | | 2.0 |
| 21 | Erl | 25.2 | 0 | 7.0 | 2.0 | 700 | | | 2.0 |
| 22 | Erl | 27.1 | 0 | 7.0 | 2.7 | 700 | | | 0.9 |

2–4 As a result of application, samples were thin and may have been over-dried which lead to brittleness
7 UL 94-VO
15 1% OSi A-186 coupler The adhesion of the plated copper lines, 100 mil wide, to the photoimaged dielectric film of examples 7, 18, 19, and 20, was determined. Example 7 displayed a copper adhesion of 2.95 lbs pull strength. The adhesion was determined by pulling-copper metallization lying atop the dielectric film with a tensile tester according to the procedure described in IPC-TM-650, method 2.4.8 Peel Strength of Metallic Clad Laminates, revision c, December 1994, Institute for Interconnecting and Packaging Electronic Circuits, 7380 North Lincoln Ave., Lincolnwood, Ill. The adhesion values were determined to be typically greater than 2 pounds per inch. The results are shown in Table 1.

Although certain embodiments of this invention have been shown and described, various adaptations and modifications can be made without departing from the scope of the invention as defined in the appended claims.

What is claimed is:

1. A method of fabricating a circuitized structure comprising the steps of:
    a. providing a circuitized substrate;
    b. applying a photoimagable dielectric film to the circuitized substrate, wherein the dielectric film is an epoxy resin system comprising:
        i. from about 5% to 80% of phenoxy polyol resin which is the condensation product of epichlorohydrin and bisphenol A, having a molecular weight of from about 40,000 to 130,000;
        ii. from about 0% to 90% of an epoxidized multifunctional bisphenol A formaldehyde novolac resin having a molecular weight of from about 4,000 to 10,000;
        iii. from 20% to 50% of a diglycidyl ether of bisphenol A having a molecular weight of from about 600 to 2,500;
        iv. less than 15% of a cationic photoinitiator;
        v. from about 15% to about 35% liquid epoxy resin, having a molecular weight of from about 200 to about 600; and
        VI. from 0% to about 30% of a rheology modifier, and less than about 3% solvent;
    c. photoimaging said dielectric film to form photoimaged vias therein;
    d. plating circuitry on, and adherent to, the photoimaged dielectric film, at least one circuit on the photoimaged dielectric film being electrically connected to the circuitization on the substrate through said at least one via, and
    e. curing said photoimaged dielectric film.

2. The method of claim 1, wherein the epoxy resin system comprises:
    from 10% to 40% of phenoxy polyol resin having a molecular weight of from about 60,000 to 90,000;
    from about 12% to 30% of an epoxidized multifunctional bisphenol A formaldehyde novolac resin having a molecular weight of from about 5,000 to 7,000;
    from about 25% to 40% of said diglycidyl ether of bisphenol A having a molecular weight of from about 1,000 to 1,700 wherein said diglycidyl ether bisphenol A is brominated; and
    from about 15% to about 30% liquid epoxy resin, having a molecular weight of from about 250 to about 400.

3. The method of claim 1, wherein the epoxy resin comprises: from 15% to about 30% of the phenoxy polyol resin; from about 15% to about 20% of the epoxidized multifunctional bisphenol A formaldehyde novolac resin;
    from about 27% to about 35%, of the diglycidyl ether of bisphenol A; and
    from about 20% to about 30% of the liquid epoxy resin wherein the rheology modifier is silica and there is less than about 2% of the solvent.

4. The method of claim 3, wherein:
    the phenoxy polyol resin has an epoxy value of about 0.03 equivalents per kg, a weight per epoxide of about 37,000 and a glass transition temperature of about 98° C.;
    the epoxidized multifunctional bisphenol A formaldehyde novolac resin has an epoxy value of about 4.7 equivalents per kilogram, as weight per epoxide of about 215 and a melting point of about 82° C.;
    the diglycidyl ether of bisphenol A has an epoxy value of about 1.5 equivalents per kilogram, a weight per epoxide of about 675 and a melting point of about 97° C.; and
    about 5 parts by weight of the resin weight complex triarylsulfonium hexafluoroantimonate salt photoinitiator.

5. The method of claim 4, wherein circuitized structure is a circuit board, card, carrier, organic or inorganic single chip module, organic or inorganic multi-chip module, ceramic carrier or interposer card.

6. The method of claim 1, wherein the epoxy resin comprises:
    from about 10% to 40% of phenoxy polyol resin which is the condensation product of epichlorohydrin and bisphenol A, having a molecular weight of from about 40,000 to 130,000;
    from 25% to 40% of the diglycidyl ether of bisphenol A having a molecular weight of from about 600 to 2,500;
    from 15% to about 32% liquid epoxy resin, having a molecular weight of from about 200 to about 600.

7. The method of claim 1, wherein the epoxy resin comprises:
    from about 15% to 30% of phenoxy polyol resin which is the condensation product of epichlorohydrin and bisphenol A, having a molecular weight of from about 40,000 to 130,000;
    from 27% to 35% of the diglycidyl ether of bisphenol A having a molecular weight of from about 600 to 2,500; and
    from about 20% to about 30% liquid epoxy resin, having a molecular weight of from about 200 to about 600;
    wherein the rheology modifier is silica and there is less than about 2% of the solvent.

8. The method of claim 7, wherein said photoimaged dielectric film lacks an epoxidized multifunctional bisphenol A formaldehyde novolac resin.

* * * * *